United States Patent [19]

Steingroever

[11] 4,258,405

[45] Mar. 24, 1981

[54] ELECTRICAL IMPULSE GENERATOR

[76] Inventor: Erich A. Steingroever, Flensburger Strasse 33, 53 Bonn, Fed. Rep. of Germany

[21] Appl. No.: 12,804

[22] Filed: Feb. 16, 1979

[51] Int. Cl.³ .......................................... H01H 47/30
[52] U.S. Cl. .................................................. 361/156
[58] Field of Search ................................ 361/155, 156

[56] References Cited

U.S. PATENT DOCUMENTS

| | | | |
|---|---|---|---|
| 3,467,894 | 9/1969 | Blume | 361/156 |
| 3,596,144 | 7/1971 | Cunningham | 361/156 X |
| 3,684,983 | 8/1972 | Cotter et al. | 361/156 X |
| 3,998,081 | 12/1976 | Hansen et al. | 361/156 X |

FOREIGN PATENT DOCUMENTS 1058608  6/1959  Fed. Rep. of Germany .......... 361/156

*Primary Examiner*—Harry E. Moose, Jr.
*Attorney, Agent, or Firm*—Fisher, Cristen & Sabol

[57] ABSTRACT

An electrical impulse generator circuit utilizes a capacitor to capture the energy stored in an inductance immediately after the high current discharge is fired.

11 Claims, 2 Drawing Figures

ELECTRICAL IMPULSE GENERATOR

BACKGROUND OF THE INVENTION

The invention concerns an electrical impulse generator for the production of high-current impulses in an inductance by the discharge of a capacitor, as used for the magnetization of a permanent magnet, the alignment of magnetic powders in the manufacture of anisotropic permanent magnets, for the mechanical deformation of work pieces, or for the production of intense magnetic fields in atomic engineering.

DESCRIPTION OF THE PRIOR ART

Impulse generators of this type are known. They can be equipped with electrolytic capacitors or with metal-paper capacitors. Electrolytic capacitors have the advantage of high capacity per volume but the disadvantage that they may not be reversed in polarity, i.e. that they are destroyed by a reverse voltage of even a few volts. Metal-paper capacitors do not have this disadvantage and can be reversed in polarity; on the other hand, however, they have a capacity per volume only one fifth to one quarter as large.

As is known, the maximal current in an undamped discharge (R=0) is higher by the factor $e=2.718$ than in the discharge in the aperiodic limiting case ($R=2\sqrt{L/C}$). Without special means, the discharge circuit in the known manner was dimensioned in such a way that no polarity-reversal of the electrolytic capacitors occurred, either by seeing to it that there was aperiodic damping ($R<2\sqrt{L/C}$) or by wiring a diode in parallel with the inductance so that the magnetic energy of the inductance is transformed into Joulean heat by maintaining the current in it. Both lead to an inadmissible heating of the inductance and limit the impulse frequency or require special measures for cooling.

SUMMARY OF THE INVENTION

The inventor has posed himself the task of producing high-current impulses in an inductance with electrolytic capacitors without there arising the inadmissible heating of the inductance. This is possible when the circuit formed from capacitor C and inductance L is only slightly damped, i.e. when the resistance of the discharge circuit $R<2\sqrt{L/C}$.

The invention lies in the fact that the magnetic energy stored in the inductance after the discharge of the capacitor is used to charge a capacitor. The latter can be a second capacitor; however, using a circuit specified in the following the discharged capacitor also can be completely or partially recharged with the original polarity.

In the following two examples of execution of the invention are described.

Figure 1:
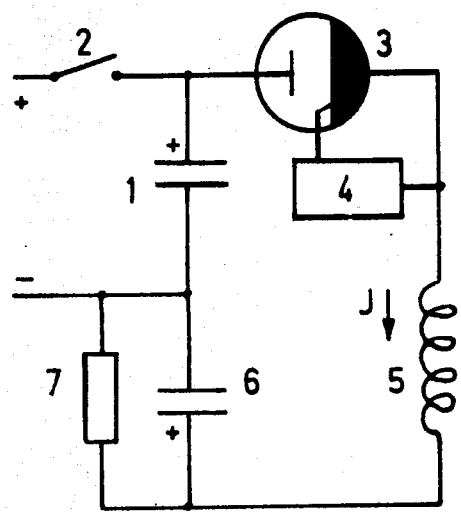
FIG. 1 is a schematic diagram of a prepared simplified circuit of an impulse generator according to the invention.

In FIG. 1 a circuit is specified in which the magnetic energy stored in the inductance L is used at least in part to charge a second capacitor. The circuit comprises a capacitor 1, connected by a switch 2 to a direct current source of energy (not shown) having the polarity indicated by symbols "+" and "−", a high current switch 3, here shown as an ignitron, an ignition circuit 4 for the ignitron, a field coil 5 in which a high magnetic field is produced by the high discharge current of the capacitor 1, a second capacitor 6, and a discharge resister 7 for the second capacitor. The impulse energy supplied via switch 2 is stored in capacitor 1. On ignition of the high-current switch 3, here represented as an ignitron, through the ignition circuit 4 there is produced a current impulse J through the inductance 5, whereby the second capacitor 6 is charged. It is polarized in such a way that it can absorb this current, thus in the opposite polarization from 1. When the voltage at the ignitron 3 drops to zero it is extinguished and a part of the energy not used in the resistance R of the circuit is present as a charge in capacitor 6. Since the latter cannot again discharge via 5 and 3 its charge flows via a resistor 7 that is located outside of L and is easy to cool.

Another arrangement for the production of high-current impulses in accordance with the invention consists in utilizing two high-current switches and two diodes, whereby a capacitor is discharged via an inductance and the energy stored in the magnetic field of the inductance is returned to the same capacitor with the same polarity. Such an arrangement is represented in FIG. 2.

Capacitor 8 stores the impulse energy supplied via switch 9. In the connections to the inductance 10 there are situated the two high-current switches 11 and 12, here represented as ignitrons. If they are simultaneously ignited by the ignition circuits 13 and 14 then the capacitor 8 discharges and a current impulse flows through the inductance 10. When the capacitor has discharged the two ignitrons are extinguished; the energy stored in the magnetic field of the inductance 10 now flows back into the capacitor via the diodes 15 and 16. With vanishingly small resistance R of the circuit the capacitor is recharged to the original voltage.

With a finite resistance R and with the loading of the inductance, e.g. by a body 17 to be magnetized, the re-stored energy is equal to the original energy reduced by the heat energy produced in R and by the magnetic energy stored in the magnet 17.

Figure 2:
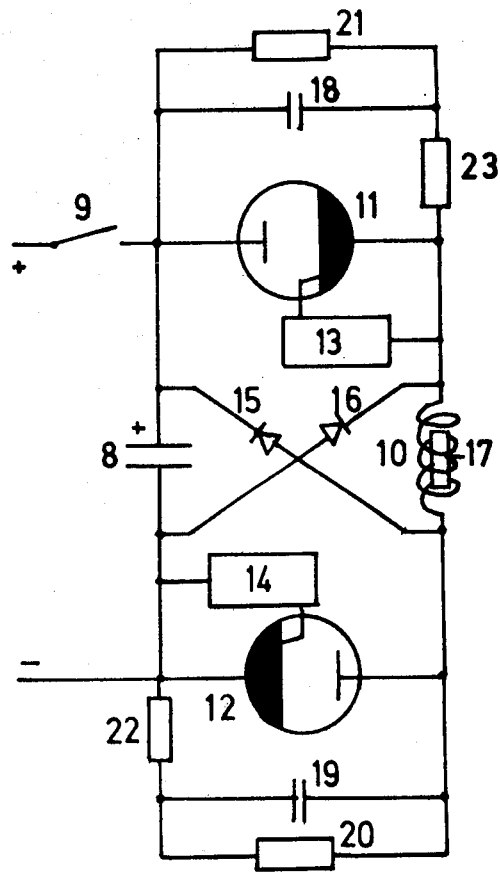
FIG. 2 is a schematic diagram of an alternative circuit for the impulse generator.

A particular advantage of the last described arrangement in accordance with FIG. 2 is that the ignition of the two high-current switches takes place simultaneously. This is achieved by simultaneous activation of the two ignition circuits 13 and 14, e.g. via an ignition transformer with two secondary windings that each connect with one of the two ignition circuits.

The ignition of the two high-current switches 11 and 12 can be facilitated in accordance with the invention by wiring each switch in parallel with a capacitor 18 or 19 charged via the resistances 20 and 21. As soon as one of the two high-current switches fires, the capacitor in parallel with it discharges via another resistance 22 or 23 and keeps it open until the other high-current switch has fired.

I claim:

1. Electrical impulse generating circuit means comprising capacitor means to be initially charged from a direct current source, inductance means, electrical switching means and polarity reversing means, said switching means and polarity reversing means being connected between the capacitor means and inductance means to fully energize said inductance means by discharge of said capacitor means when the switching means is conductive and to at least partially charge the capacitor means by undamped deenergizing of the inductance means when the switching means is non-conductive, the polarity of the inductance means and capacitor means being unchanged at all times.

2. Electrical impulse generating circuit means as defined in claim 1, wherein said polarity reversing means includes additional capacitor means connected in the circuit means to be charged with a polarity opposite to that of the first-mentioned capacitor means when said switching means is conductive.

3. Electrical impulse generating circuit means as defined in claim 1, wherein said polarity reversing means includes two electrical switching means each connected between the respective opposite connections for the capacitor means and inductance means, and two rectifier means, each connected to bridge the inductance means and a respective one of said switching means.

4. Electrical impulse generating circuit means as defined in any one of claims 1, 2 or 3, wherein said switching means comprise ignitrons, or thyristors.

5. Electrical impulse generating circuit means as defined in claim 3, wherein said two switching means are simultaneously conductive.

6. Electrical impulse generating circuit means as defined in claim 4, wherein said two switching means are simultaneously conductive.

7. Electrical impulse generating circuit means as defined in claim 3, wherein said circuit means includes actuating means for said two switching means for maintaining said switching means conductive so long as current flows through the switching means.

8. Electrical impulse generating circuit means as defined in claim 4, wherein said circuit means includes actuating means for said two switching means for maintaining said switching means conductive so long as current flow through the switching means.

9. Electrical impulse generating circuit means as defined in any one of claims 1, 2 or 3, wherein said capacitor means for energizing said inductance means are electrolytic.

10. Electrical impulse generating circuit means as defined in any of claims 1, 2 or 3, wherein said inductance means generates a magnetic field for magnetizing a permanent magnet.

11. Electrical impulse generating circuit means as defined in any one of claims 1, 2 or 3, wherein said inductance means generates a magnetic field for the alignment of magnetic powders for production of anisotropic magnets.

* * * * *